(12) United States Patent
Arimura et al.

(10) Patent No.: US 6,903,591 B2
(45) Date of Patent: Jun. 7, 2005

(54) PHASE SHIFTER CIRCUIT

(75) Inventors: Kazuyoshi Arimura, Kasugai (JP); Tsuyoshi Moribe, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/201,739

(22) Filed: Jul. 24, 2002

(65) Prior Publication Data

US 2002/0180504 A1 Dec. 5, 2002

Related U.S. Application Data

(62) Division of application No. 09/668,381, filed on Sep. 25, 2000, now Pat. No. 6,452,434.

(30) Foreign Application Priority Data

Jan. 27, 2000 (JP) ........................................ 2000-018914
Jun. 15, 2000 (JP) ........................................ 2000-179469

(51) Int. Cl.[7] ........................ H03H 11/16; H03K 3/00; H03K 5/13
(52) U.S. Cl. ...................... 327/231; 327/238; 327/246; 327/254
(58) Field of Search ................................. 327/231–240, 327/246–247, 254–259; 455/326, 333; 330/252–254

(56) References Cited

U.S. PATENT DOCUMENTS

| | | | |
|---|---|---|---|
| 4,782,246 A | * 11/1988 | Kuroyanagi et al. | 327/236 |
| 4,797,634 A | 1/1989 | Filliman | 331/12 |
| 4,866,314 A | 9/1989 | Traa | 327/280 |
| 5,185,581 A | 2/1993 | Brown | 330/254 |
| 5,297,157 A | 3/1994 | Kaiser et al. | 327/38 |
| 5,373,741 A | 12/1994 | Volkmann et al. | 73/602 |
| 5,619,169 A | 4/1997 | Matsuura | 330/254 |
| 5,926,052 A | * 7/1999 | Dow et al. | 327/234 |
| 5,945,860 A | * 8/1999 | Guay et al. | 327/246 |
| 5,963,073 A | * 10/1999 | Fujita et al. | 327/254 |
| 6,104,226 A | 8/2000 | Weber | 327/359 |
| 6,141,169 A | 10/2000 | Pietruszynski et al. | 360/67 |
| 6,163,215 A | 12/2000 | Shibata et al. | 330/254 |

FOREIGN PATENT DOCUMENTS

| | | | | |
|---|---|---|---|---|
| JP | 52066352 | | 6/1977 | |
| JP | 62053511 A | * | 3/1987 | ............ H03H/7/20 |
| JP | 62072217 | | 4/1987 | |
| JP | 07115376 | | 5/1995 | |
| WO | WO 9927648 A1 | * | 6/1999 | ............ H03H/11/22 |

* cited by examiner

Primary Examiner—Quan Tra
(74) Attorney, Agent, or Firm—Arent Fox PLLC

(57) ABSTRACT

A phase shift circuit that generates a phase shift signal whose amplitude matches at a plurality of frequencies without increasing the circuit area. The phase shifter circuit includes first and second differential amplifiers which generate first and second first phase shift signals having a first amplitude at a first frequency. A third differential amplifier is connected in parallel to the first differential amplifier. The third differential amplifier generates a third phase shift signal having substantially the same amplitude as the first amplitude at a second frequency. The first differential amplifier is activated in accordance with the first frequency and the third differential amplifier is activated in accordance with the second frequency.

20 Claims, 13 Drawing Sheets

PHASE SHIFTER CIRCUIT

This is a Division of application Ser. No. 09/668,381 filed Sep. 25, 2000, now U.S. Pat. No. 6,452,434. The disclosure of the prior application is hereby incorporated by reference herein in its entirety.

BACKGROUND OF THE INVENTION

The present invention relates to a phase shifter circuit, and, more particularly, to a phase shifter circuit used in a mixer or a modulator of radio communication apparatus, such as a cellular telephone.

FIG. 1 is a schematic circuit diagram of a conventional phase shifter circuit 10.

The phase shifter circuit 10 comprises a first differential amplifier 11 that receives an input signal (analog frequency signal) Sin and generates first and second phase shift signals S1, S2 having a phase difference of 180 degrees (e.g. 0° and 180°) with each other and a second differential amplifier 12 that receives an input signal Sin and generates third and fourth phase shift signals S3, S4 having the phase difference of 180 degrees (e.g. 90° and 270°) with each other. FIG. 3 is a graph showing the relationship between frequency and phase in each of the phase shift signals. As shown in FIG. 3, each of the phase differences between the phase shift signals S1, S3, between the phase shift signals S2, S3, between the phase shift signals S2, S4 and between the phase shift signals S4, S1 is 90 degrees. The graph shows that the phase shifter circuit 10 holds the phase differences of the respective phase shift signals S1 to S4 at 90 degrees at any frequency.

FIG. 2 is a graph showing the relationship between frequency and amplitude in each of the phase shift signals. As shown in this graph, however, the conventional phase shifter circuit 10 matches the amplitude of the first and second phase shift signals S1, S2 and the amplitude of the third and fourth phase shift signals S3, S4 only at a certain frequency (f0).

The phase shifter circuit 10, for example, as shown in FIG. 4, is applied to a mixer circuit 20 for a radio communication apparatus which switches a plurality of IF frequencies. A phase shifter circuit 10a receives an intermediate frequency signal IFin as the input signal Sin and generates first to fourth intermediate frequency signals. A limit amplifier 21a for matching the amplitude of the first to fourth intermediate frequency signals at a plurality of frequencies is connected to the phase shifter circuit 10a. A phase shifter circuit 10b receives a local oscillation signal LOin as the input signal Sin and generates first to fourth local oscillation signals. A limit amplifier 21b for matching the amplitude of the first to fourth local oscillation signals at a plurality of frequencies is connected to the phase shifter circuit 10b. Accordingly, the first to fourth intermediate frequency signals and first to fourth local oscillation signals whose amplitudes are balanced are supplied to modulation mixers 22a, 22b. However, use of the limit amplifiers 21a, 21b increases the circuit area and power consumption of the mixer circuit 20.

SUMMARY OF THE INVENTION

An object of the present invention is to provide a phase shifter circuit which generates a phase shift signal whose amplitude matches at a plurality of frequencies without increasing the circuit area.

In a first aspect of the present invention, a phase shifter circuit is provided that includes a first differential amplifier for receiving a first input signal having a first frequency and generating a first phase shift signal having a first amplitude and a second differential amplifier for receiving the first input signal and generating a second phase shift signal having a phase difference of 90 degrees between the first and second phase signals and substantially the same amplitude as the first amplitude. At least one third differential amplifier is connected in parallel to the first differential amplifier to receive a second input signal having a second frequency that is different from the first frequency and generate a third phase shift signal having substantially the same amplitude as the first amplitude. The first differential amplifier is activated in accordance with the first frequency and the at least one third differential amplifier is activated in accordance with the second frequency.

In a second aspect of the present invention, a phase shifter circuit is provided that includes a first differential amplifier for receiving a first input signal having a first frequency and generates a first phase shift signal having a first amplitude and a second differential amplifier for receiving the first input signal and generates a second phase shift signal having a phase difference of 90 degrees between the first and second phase shift signals and substantially the same amplitude as the first amplitude. At least one third differential amplifier is connected in parallel to the first differential amplifier to receive a second input signal having a second frequency that is different from the first frequency and generate a third phase shift signal having substantially the same amplitude as the first amplitude. At least one fourth differential amplifier is connected in parallel to the second differential amplifier to receive the second input signal and generate a fourth phase shift signal having a phase difference of 90 degrees between the second and third phase shift signal and substantially the same amplitude as the first amplitude. The first and second differential amplifier are activated in accordance with the first frequency and the at least one third differential amplifier and the at least one fourth differential amplifier are activated in accordance with the second frequency.

In a third aspect of the present invention, a phase shifter circuit is provided that includes a first differential amplifier for receiving an input signal having a predetermined frequency and generating a first phase shift signal in accordance with a first predetermined gain and a second differential amplifier for receiving the input signal and generating a second phase shift signal having a phase difference of 90 degrees between the first and second phase shift signals in accordance with a second predetermined gain. A control circuit is connected to the first and second differential amplifiers to receive the input signal and control the first and second predetermined gains of the first and second differential amplifiers based on an amplitude of the input signal at the predetermined frequency of the input signal.

In a fourth aspect of the present invention, a phase shifter circuit is provided that includes a first differential amplifier for receiving an input signal having a predetermined frequency and generating a first phase shift signal in accordance with a first gain in response to a first control signal and a second differential amplifier for receiving the input signal and generating a second phase shift signal having a phase difference of 90 degrees between the first and second phase shift signals in accordance with a second gain in response to the first control signal. A third differential amplifier is connected to the first differential amplifier to receive the input signal and generate a third phase shift signal in accordance with a third gain that is different from the first gain in response to a second control signal. A fourth differential amplifier is connected to the second differential amplifier to receive the input signal and generate a fourth phase shift signal in accordance with a fourth gain that is different from the second gain in response to the second control signal. A control circuit is connected to the first to fourth differential amplifiers to receive the input signal and selectively supply the first and second control signals to the first to fourth differential amplifiers based on an amplitude of the input signal at the predetermined frequency of the input signal.

In a fifth aspect of the present invention, a control circuit of a phase shifter circuit for controlling a predetermined gain of the phase shifter circuit is provided. The phase shifter circuit receives an input signal having a predetermined frequency and generates first and second phase shift signals having a phase difference of 90 degrees in accordance with the predetermined gain. The control circuit includes a control signal generation circuit for receiving the input signal and generating a control signal for controlling the predetermined gain of the phase shifter circuit based on an amplitude of the input signal at a predetermined frequency of the input signal.

In a sixth aspect of the present invention, a method for controlling a predetermined gain of a phase shifter circuit is provided. The phase shifter circuit receives an input signal having a predetermined frequency and generates first and second phase shift signals having a phase difference of 90 degrees from each other in accordance with the predetermined gain. First, a frequency-amplitude signal having an amplitude corresponding to the predetermined frequency of the input signal is generated. Then, the predetermined gain of the phase shifter circuit is controlled based on the amplitude of the frequency-amplitude signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
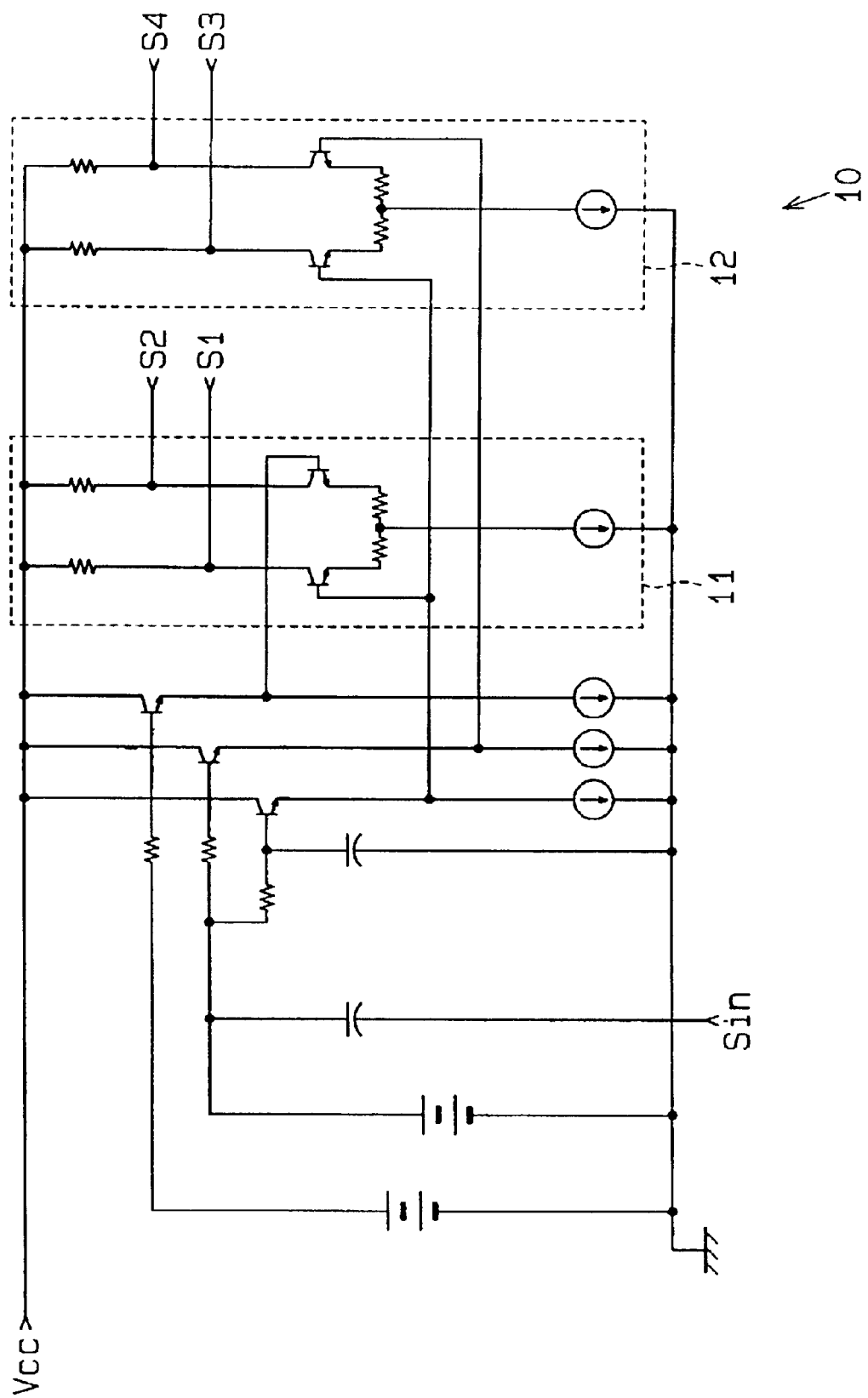
FIG. 1 is a schematic circuit diagram of a conventional phase shifter circuit.
Figure 2:
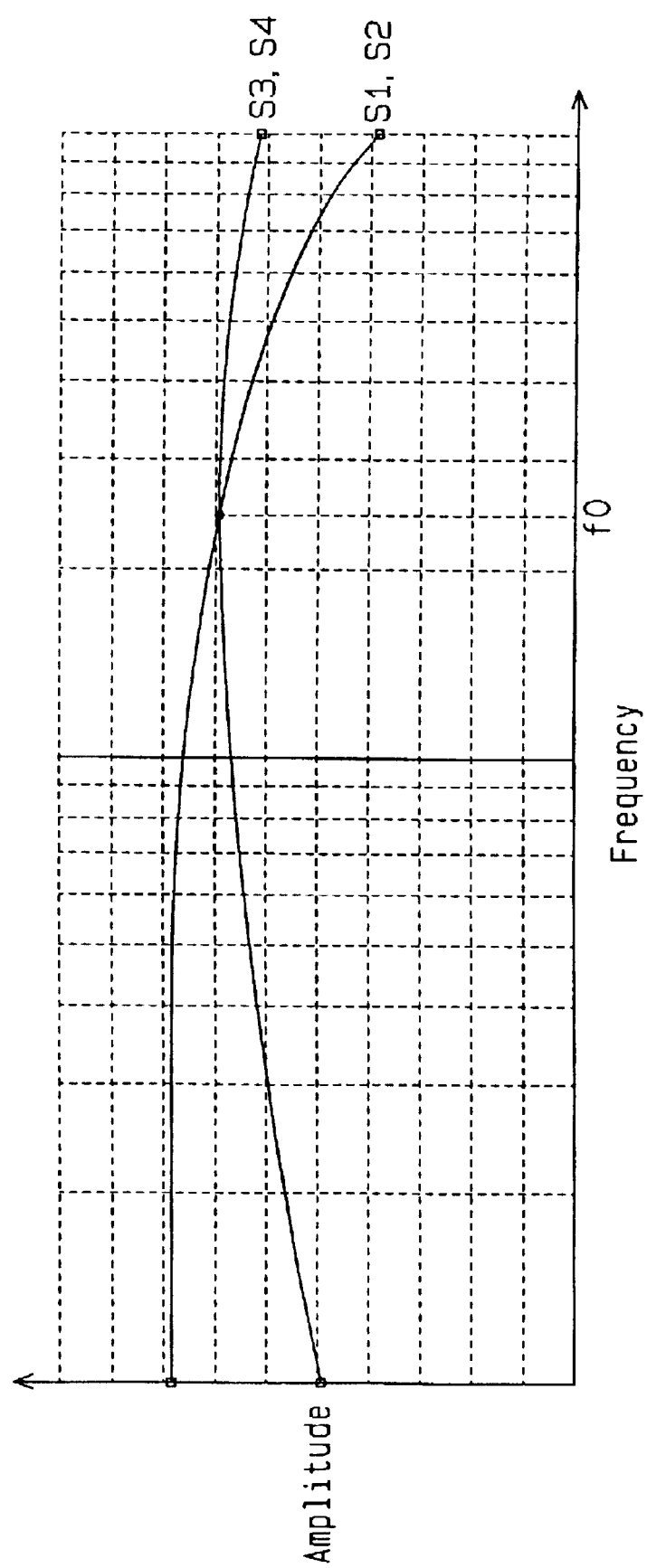
FIG. 2 is a graph showing the relationship between frequency and phase of the phase shift signals generated by the phase shifter circuit of FIG. 1.
Figure 3:
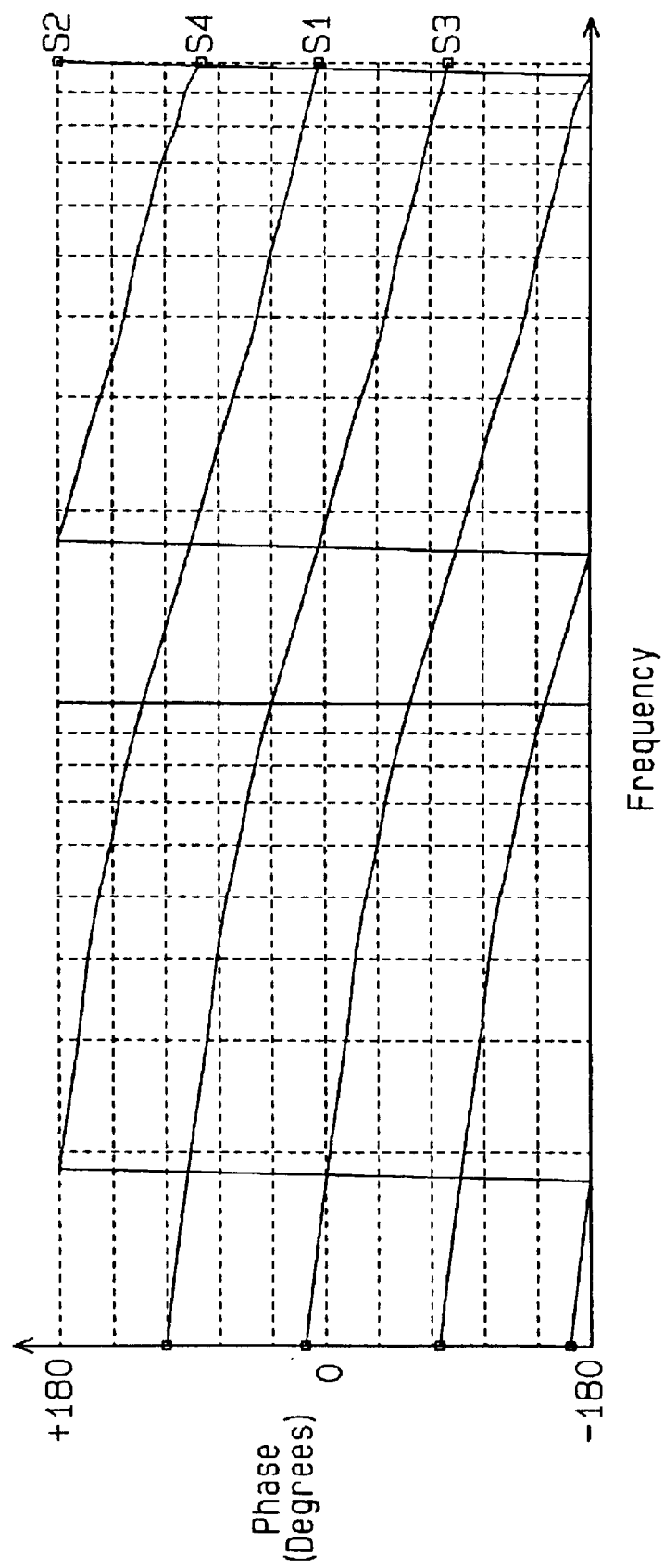
FIG. 3 is a graph showing the relationship between frequency and amplitude of the phase shift signals generated by the phase shifter circuit of FIG. 1.

In the drawings, like numerals are used for like elements throughout.

Figure 5:
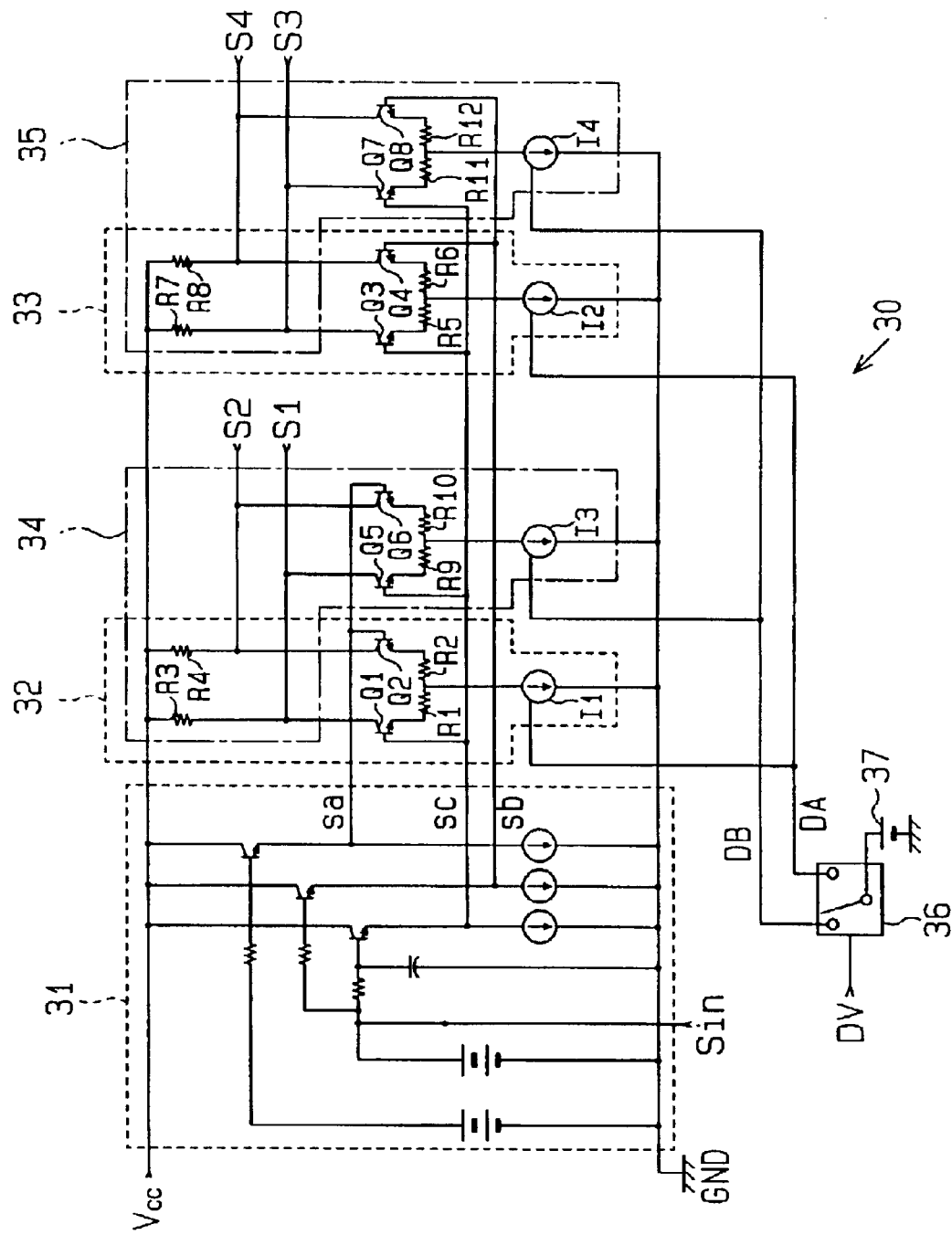
FIG. 5 is a schematic circuit diagram of a phase shifter circuit according to a first embodiment of the present invention.
Figure 6:
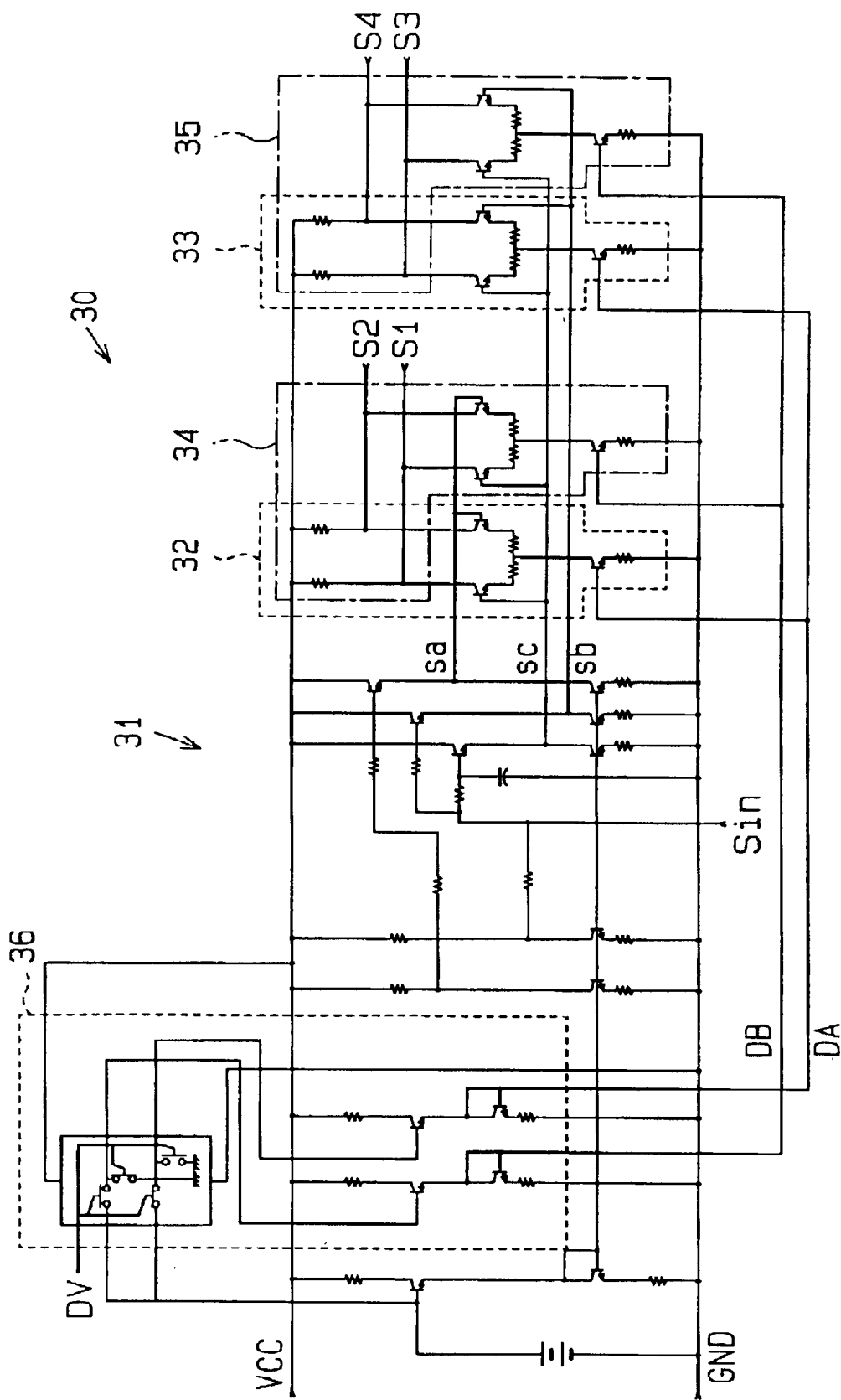
FIG. 6 is a detailed circuit diagram of the phase shifter circuit of FIG. 5.

FIG. 5 is a schematic circuit diagram of a phase shifter circuit 30 according to a first embodiment of the present invention. FIG. 6 is a detailed circuit diagram of the phase shifter circuit 30. The phase shifter circuit 30 includes an input section 31, four differential amplifiers 32, 33, 34 and 35 and a switching control unit 36. The phase shifter circuit 30 is preferably formed on a substrate of a semiconductor integrated circuit device.

The input section 31 receives an input signal Sin and generates a DC signal Sa, a first frequency signal Sb having an alternating component whose phase is the same as the input signal Sin, and a second frequency signal Sc having a predetermined phase difference to the first frequency signal Sb. The DC signal Sa and the second frequency signal Sc are both supplied to the first and third differential amplifiers 32, 34 and the first and second frequency signals Sb, Sc are both supplied to the second and fourth differential amplifiers 33, 35. The first through fourth differential amplifiers 32, 33, 34 and 35 generate four phase-shifted signals S1, S2, S3 and S4 having a phase difference of 90 degrees from the DC signal Sa and the first and second frequency signals Sb, Sc.

The first differential amplifier 32 includes a pair of differential NPN transistors Q1, Q2, resistors R1, R2, load resistors R3, R4 and a constant current source I1. The resistors R1, R2 are connected in series between the emitters of the NPN transistors Q1, Q2 and the collectors of the NPN transistors Q1, Q2 are connected to a high potential power supply Vcc via the load resistors R3, R4. The node between the resistors R1, R2 is connected to a ground GND via the constant current source I1.

The second differential amplifier 33 includes a pair of differential NPN transistors Q3, Q4, resistors R5, R6, load resistors R7, R8 and a constant current source I2. The resistors R5, R6 are connected in series between the emitters of the NPN transistors Q3, Q4 and the collectors of the NPN transistors Q3, Q4 are connected to the high potential power supply Vcc via the load resistors R7, R8. The node between the resistors R5, R6 is connected to the ground GND via the constant current source I2.

The third differential amplifier 34 includes a pair of differential NPN transistors Q5, Q6, resistors R9, R10, the load resistors R3, R4 and a constant current source I3. The resistors R9, R10 are connected in series between the emitters of the NPN transistors Q5, Q6 and the collectors of the NPN transistors Q5, Q6 are connected to the high potential power supply Vcc via the load resistors R3, R4.

The node between the resistors R9, R10 is connected to the ground GND via a constant current source I3.

The fourth differential amplifier 35 includes a pair of differential NPN transistors Q7, Q8, resistors R11, R12, the load resistors R7, R8 and a constant current source I4. The resistors R11, R12 are connected in series between the emitters of the NPN transistors Q7, Q8 and the collectors of the NPN transistors Q7, Q8 are connected to the high potential power supply Vcc via the load resistors R7, R8. The node between the resistors R11, R12 is connected to the ground GND via the constant current source I4.

The first and third differential amplifiers 32, 34 share the load resistors R3, R4 and the second and fourth differential amplifiers 33, 35 share the load resistors R7, R8. The first to fourth differential amplifiers 32 to 35 share the input section 31.

The first to fourth differential amplifiers 32 to 35 each have a different gain, but have the same gain at two predetermined frequencies. Specifically, the first and second differential amplifiers 32, 33 have the same gain at a predetermined first frequency f1 and the third and fourth differential amplifiers 34, 35 have the same gain at a predetermined second frequency f2. Further, the gains of the first and second differential amplifiers 32, 33 at the first frequency f1 are substantially identical with the gains of the third and fourth differential amplifiers 34, 35 at the second frequency f2.

The gains of the respective differential amplifiers 32 to 35 can easily be changed by adjusting values of the respective emitter resistors R1, R2, R5, R6, R9, R10, R11 and R12. Through the adjustment of these resistance values, a gain is set so that the output amplitude of the respective differential amplifiers 32 to 35 matches at the first and second frequencies f1, f2.

In the first differential amplifier 32, the second frequency signal Sc is supplied to the base of the transistor Q1 and the DC signal Sa is supplied to the base of the transistor Q2, so that the first and second phase shift signals S1, S2 are output from the nodes between the collectors of the transistors Q1, Q2 and the load resistors R3, R4. In the second differential amplifier 33, the second frequency signal Sc is supplied to the base of the transistor Q3, the DC signal Sa is supplied to the base of the transistor Q4 so that the third and fourth phase shift signals S3, S4 are output from the nodes between the collectors of the transistors Q3, Q4 and the load resistors R7, R8. First to fourth phase shift signals from the first and second differential amplifiers 32, 33 are herein referred to as S1a, S2a, S3a and S4a (see FIG. 7).

In the third differential amplifier 34, the second frequency signal Sc is supplied to the base of the transistor Q5 and the DC signal Sa is supplied to the base of the transistor Q2, so that the first and second phase shift signals S1, S2 are output from the node between the collectors of the transistors Q5, Q6 and the load resistors R3, R4. In the fourth differential amplifier 35, the second frequency signal Sc is supplied to the base of the transistor Q7 and the first frequency signal Sb is supplied to the base of the transistor Q8, so that the third and fourth phase shift signals S3, S4 are output from the node between the collectors of the transistors Q7, Q8 and the load resistors R7, R8. First to fourth phase shift signals from the third and fourth differential amplifiers 34, 35 are herein referred to as S1b, S2b, S3b and S4b (see FIG. 7).

Figure 7:
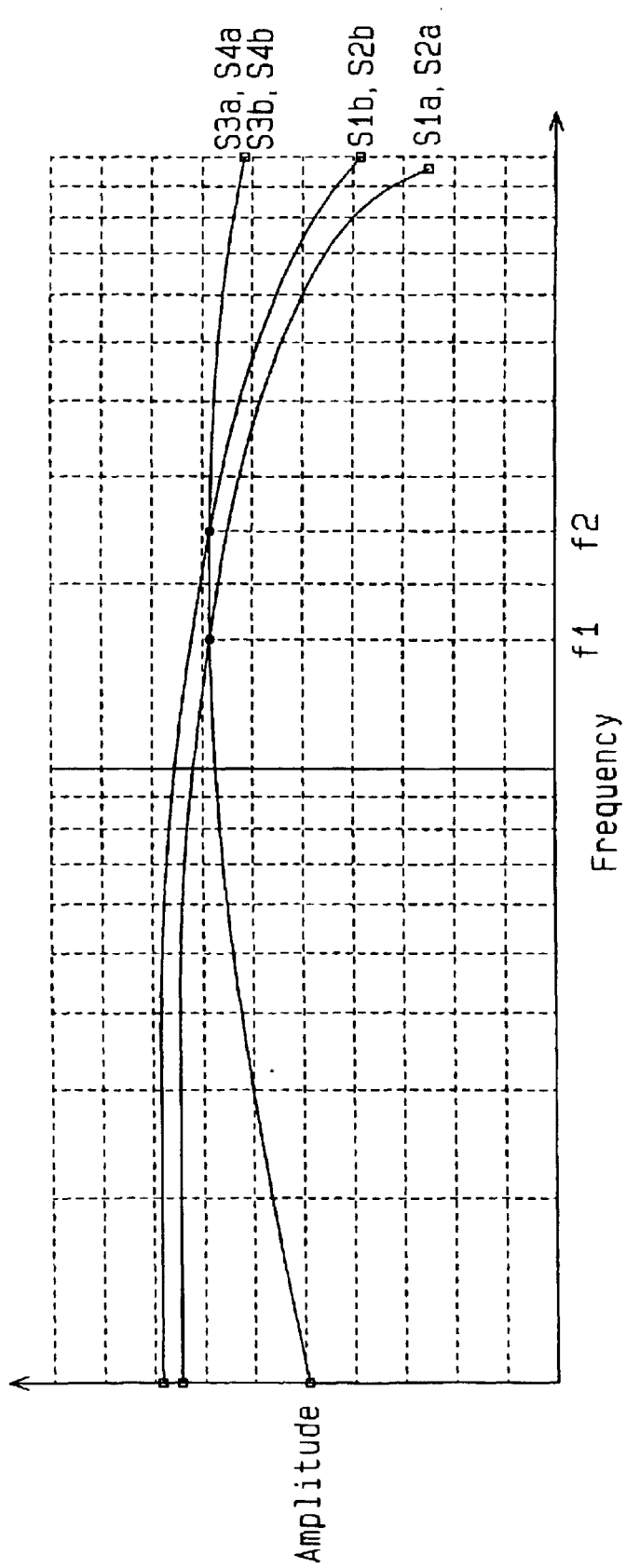
FIG. 7 is a graph showing the relationship between frequency and amplitude of the phase shift signals generated by the phase shifter circuit of FIG. 5.

FIG. 7 is a graph showing the relationship between frequencies and amplitude (gains) of the respective phase shift signals S1a, S2a, S3a, S4a, S1b, S2b, S3b and S4b. As shown in the graph, the amplitude of the respective first to fourth phase shift signals S1a, S2a, S3a and S4a from the first and second differential amplifiers 32, 33 is substantially identical at the first frequency f1. Further, the amplitude of the first to fourth phase shift signals S1b, S2b, S3b and S4b from the third and fourth differential amplifiers 34, 35 is substantially identical at the second frequency f2. Furthermore, the amplitude of the respective phase shift signals S1a, S2a, S3a and S4a at the first frequency f1 is substantially identical with the amplitude of the respective phase shift signals S1b, S2b, S3b and S4b at the second frequency f2.

In the first embodiment, the amplitude of the third and fourth phase shift signals S3a, S4a from the second differential amplifier 33 is identical with the amplitude of the third and fourth phase shift signals S3, S4b from the fourth differential amplifier 35 at the first and second frequencies f1 and f2. That is, the second and fourth differential amplifiers 33, 35 have substantially the same gain. Accordingly, the graphical lines related to the third and fourth phase shift signals S3a, S4a, S3b and S4b are represented using a single line.

Returning to FIG. 5, the switching control unit 36 supplies a control signal DA to the first and second differential amplifiers 32, 33 and a control signal DB to the third and fourth differential amplifiers 34, 35 in accordance with a frequency switching signal DV from a control device (not shown) to activate the first and second differential amplifiers 32, 33 or the third and fourth differential amplifiers 34, 35.

For example, if the frequency switching signal DV corresponds to the first frequency f1, the switching control unit 36 supplies a control signal DA having the voltage of a reference power supply 37 to the constant current sources I1 and I2 of the first and second differential amplifiers 32, 33. The constant current sources I1 and I2 supply a bias current in response to the control signal DA, causing the first and second differential amplifiers 32, 33 to operate.

If the frequency switching signal DV corresponds to the second frequency f2, the switching control unit 36 supplies a control signal DB to the constant current sources I2 and I3 of the third and fourth differential sources 34, 35. The constant current sources I2, I3 supply a bias current in response to the control signal DB, causing the third and fourth differential amplifiers 34, 35 to operate.

The frequency switching signal DV is used for instructing frequency switching to IF-VCO or IF-PLL of radio communication apparatus. That is, because the radio communication apparatus performs communication by appropriately switching the first frequency f1 and the second frequency f2, the frequency switching signal DV is supplied to IF-VCO and IF-PLL. Accordingly, a frequency switching signal generation circuit for the phase shifter circuit 30 need not be newly set by supplying the frequency switching signal DV to the phase shifter circuit 30, thereby preventing an increase of circuit area.

Figure 4:
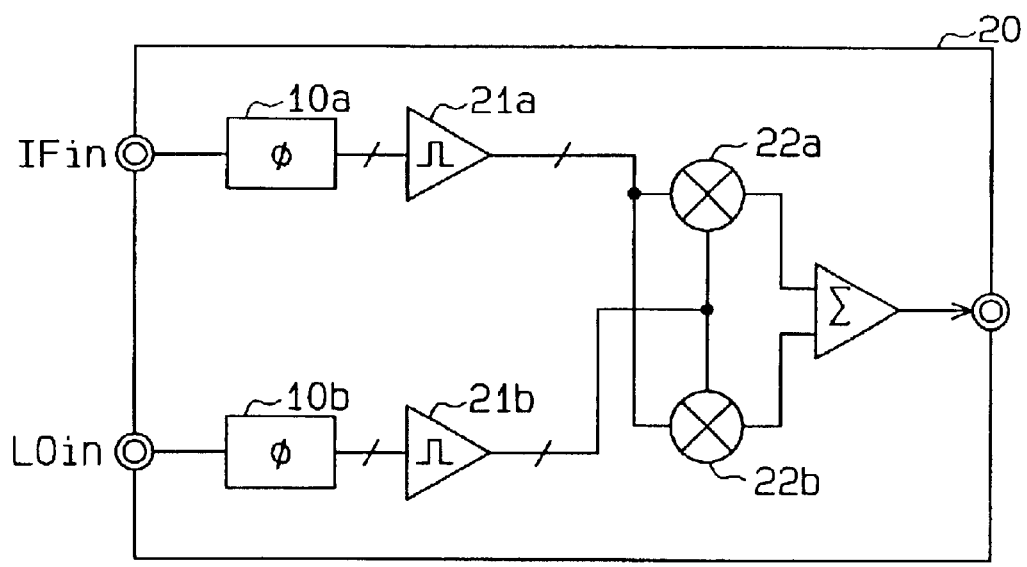
FIG. 4 is a schematic block diagram of a conventional mixer circuit.

If the phase shifter circuit 30 is used to replace the phase shifter circuits 10a, 10b of the mixer circuit 20 of FIG. 4, the limit amplifiers 21a, 21b can be omitted because the amplitude of the respective phase shift signals of the phase shifter circuit 30 is substantially identical at the first and second frequencies f1, f2. Further, the respective phase shift signals S1 to S4 of the phase shifter circuit 30 are sine waves which do not include harmonic components. Conversely, a phase shift signal which is a rectangular wave including harmonic components is output from a limit amplifier. Accordingly, in the mixer circuit 20 using the phase shifter 30, and which does not include the limit amplifier, spurious signals are reduced.

The phase shifter circuit 30 of the first embodiment has the following advantages.

(1) The phase shifter circuit 30 comprises the first and second differential amplifiers 32, 33, which operate at the first frequency f1, and the third and fourth differential amplifiers 34, 35, which operate at the second frequency f2. The gains of the first and second differential amplifiers 32, 33 at the first frequency f1 and the gains of the third and fourth differential amplifiers 34, 35 at the second frequency f2 are substantially identical. Accordingly, the amplitude of the phase shift signals S1 to S4 matches at the first and second frequencies f1 and f2.

(2) The switching control unit 36 supplies the control signal DA or DB to the constant current sources I1, I2 or I3, I4 and activates the first and second differential amplifiers 32, 33 or the third and fourth differential amplifiers 34, 35. Accordingly, the respective differential amplifiers 32 to 35 can be selectively activated according to the first and second frequencies f1, f2.

(3) The first and third differential amplifiers 32, 34 share the load resistors R3, R4 and the second and fourth differential amplifiers 33, 35 share the load resistors R7, R8. Accordingly, the number of elements of a phase shifter circuit does not increase and an increase in the size of a semiconductor integrated circuit is prevented.

Figure 8:
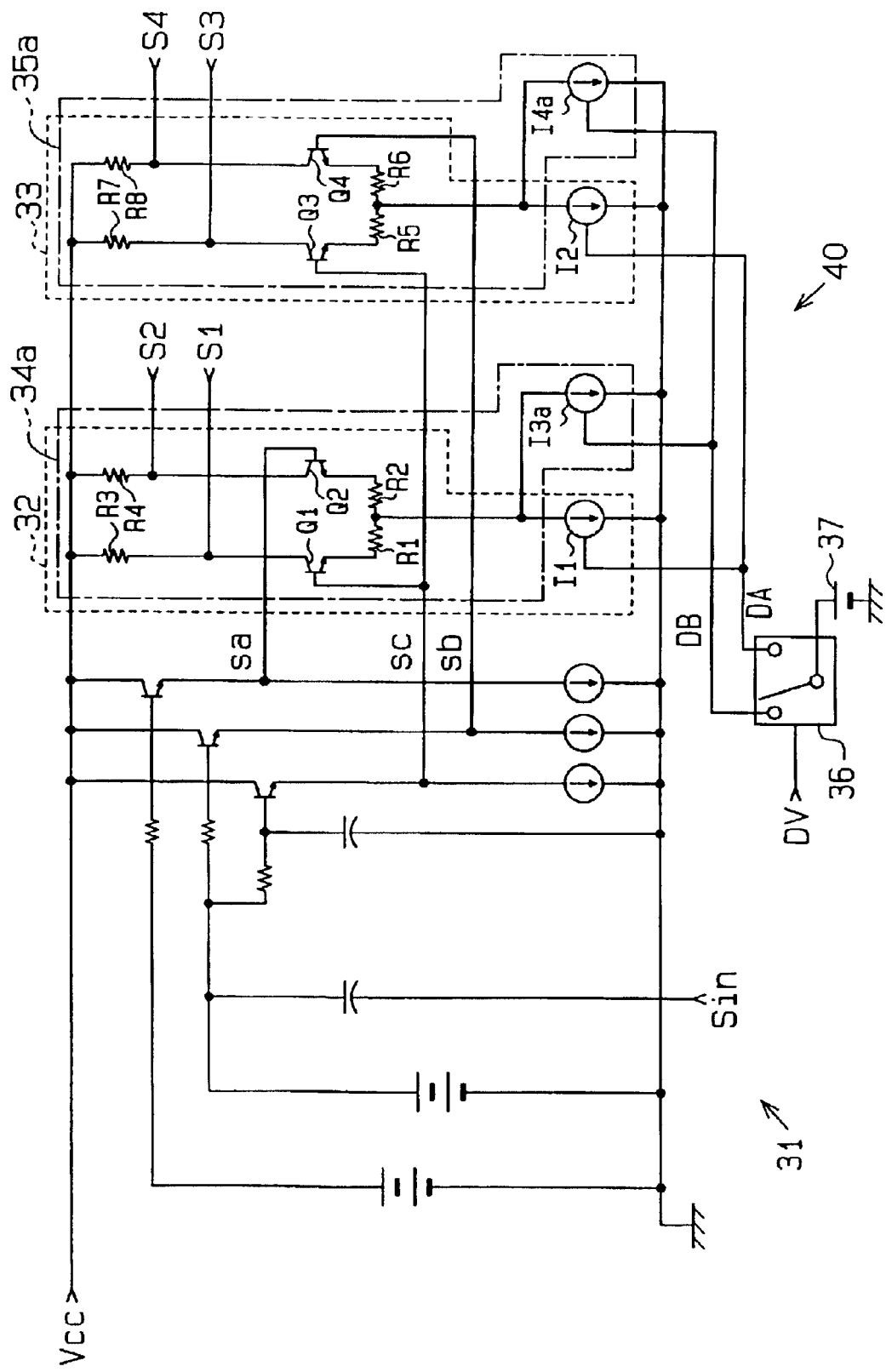
FIG. 8 is a schematic circuit diagram of a phase shifter circuit according to a second embodiment of the present invention.

FIG. 8 is a schematic circuit diagram of a phase shifter circuit 40 according to a second embodiment of the present invention. The first differential amplifier 32 and a third differential amplifier 34a share the transistors Q1, Q2, the resistors R1, R2 and the load resistors R3, R4. The second differential amplifier 33 and a fourth differential amplifier 35a share the transistors Q3, Q4, the resistors R5, R6 and the load resistors R7, R8. Bias current values of the current sources I3a, I4a of the differential amplifiers 34a, 35a are set so that the gains of the third and fourth differential amplifiers 34a, 35a differ from the gains of the first and second differential amplifiers 32, 33. That is, the bias current values of the current sources I3a, I4a differ from the bias current values of the constant current sources I1, I2. In the second embodiment, the circuit area is reduced due to an increase in the number of shared elements.

Figure 9:
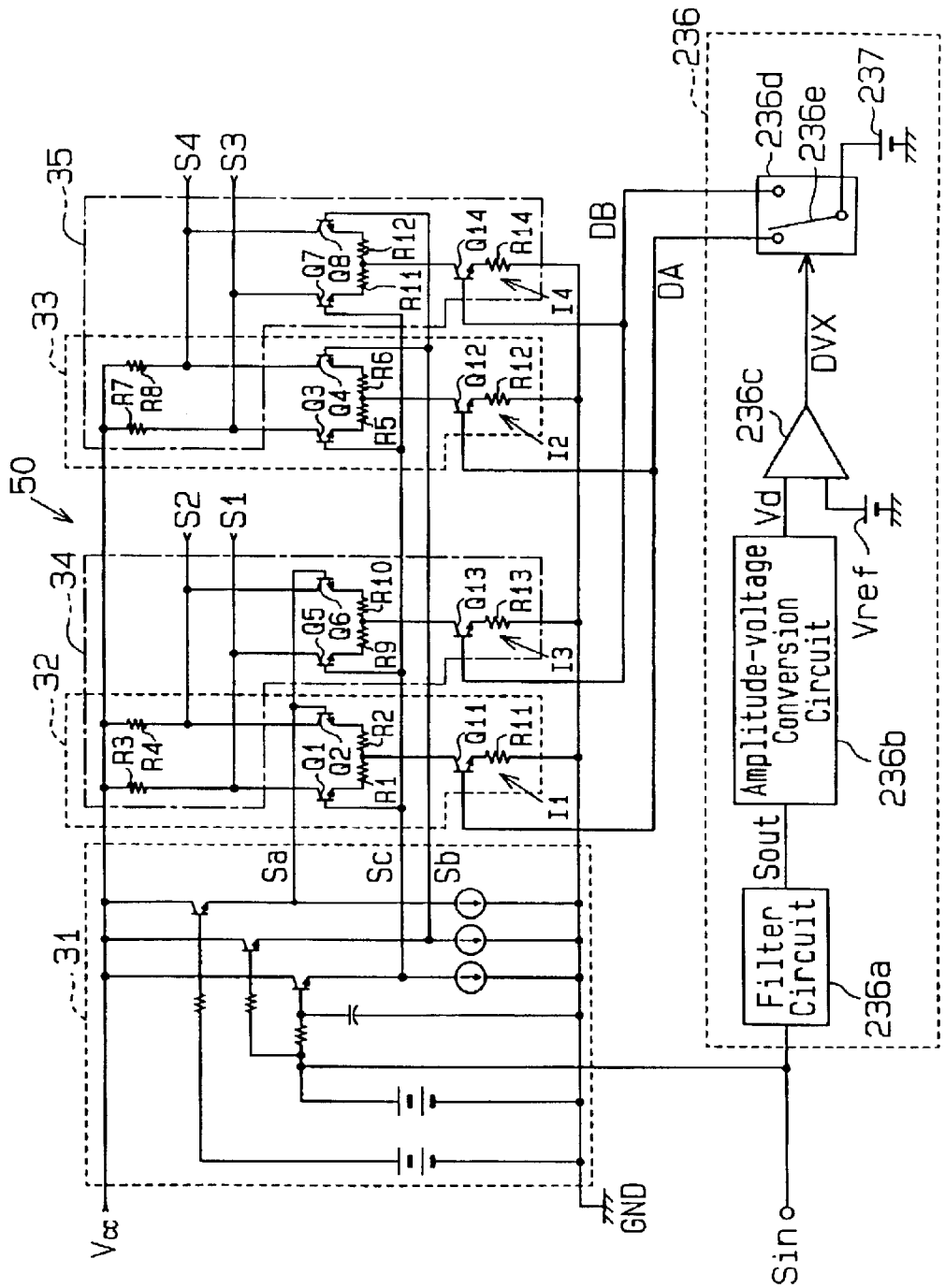
FIG. 9 is a schematic circuit diagram of a phase shifter circuit according to a third embodiment of the present invention.

FIG. 9 is a schematic circuit diagram of a phase shifter circuit 50 according to a third embodiment of the present invention. The phase shifter circuit 50 includes the input section 31, the four differential amplifiers 32, 33, 34 and 35 and a switching control unit 236. The phase shifter circuit 50 of the third embodiment, as shown in FIG. 9, has the same output characteristics as the phase shifter circuit 30 of the first embodiment.

The constant current source I1 includes an NPN transistor Q11 and a resistor R11. The constant current source I1 turns on when the control signal DA having a predetermined level is supplied to the base of the NPN transistor Q11, which activates the first differential amplifier 32.

The constant current source I2 includes an NPN transistor Q12 and a resistor R12. The constant current source I2 turns on when the control signal DA is supplied to the base of the NPN transistor Q12, which activates the second differential amplifier 33.

The constant current source I3 includes an NPN transistor Q13 and a resistor R13. The constant current source I3 turns on when the control signal DB is supplied to the base of the NPN transistor Q13, which activates the third differential amplifier 34.

The constant current source I4 includes an NPN transistor Q14 and a resistor R14. The constant current source I4 turns on when the control signal DB is supplied to the base of the NPN transistor Q14, which activates the fourth differential amplifier 35.

The switching control unit 236 generates the control signal DA for selecting the first and second differential amplifiers 32, 33 when it receives an input signal Sin having the first frequency f1. The switching control unit 236 generates the control signal DB for selecting the third and fourth differential amplifiers 34, 35 when it receives an input signal Sin having the second frequency f2.

Figure 10:
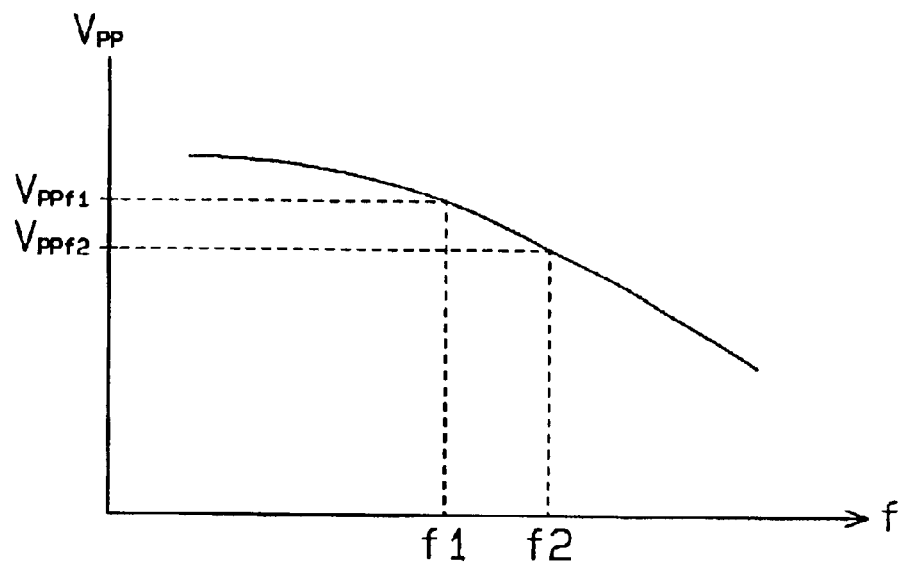
FIG. 10 is a graph showing the relationship between input frequency and output amplitude in a filter circuit of the phase shifter circuit of FIG. 9.

The switching control unit 236 includes a filter circuit 236a, an amplitude-voltage conversion circuit 236b, a comparator 236c and a switching circuit 236d. The filter circuit 236a receives the input signal Sin and generates an output signal Sout having an amplitude value Vpp which corresponds to a frequency f of the input signal Sin. Specifically, the filter circuit 236a, as shown in FIG. 10, has frequency-amplitude characteristics that reduce the amplitude value Vpp of the output signal Sout as the frequency f of the input signal Sin increases. Accordingly, if the filter circuit 236a receives the input signal Sin having the second frequency f2, it generates an output signal Sout having a higher amplitude value Vpp than the amplitude value at the time when it receives the input signal Sin having the first frequency f1. That is Vppf1>Vppf2 wherein it is assumed that the amplitude value Vpp of the output signal Sout to the input signal Sin having the first frequency f1 is "Vppf1" and the amplitude value Vpp of the output signal Sout to the input signal Sin having the second frequency f2 is "Vppf2".

Figure 11:
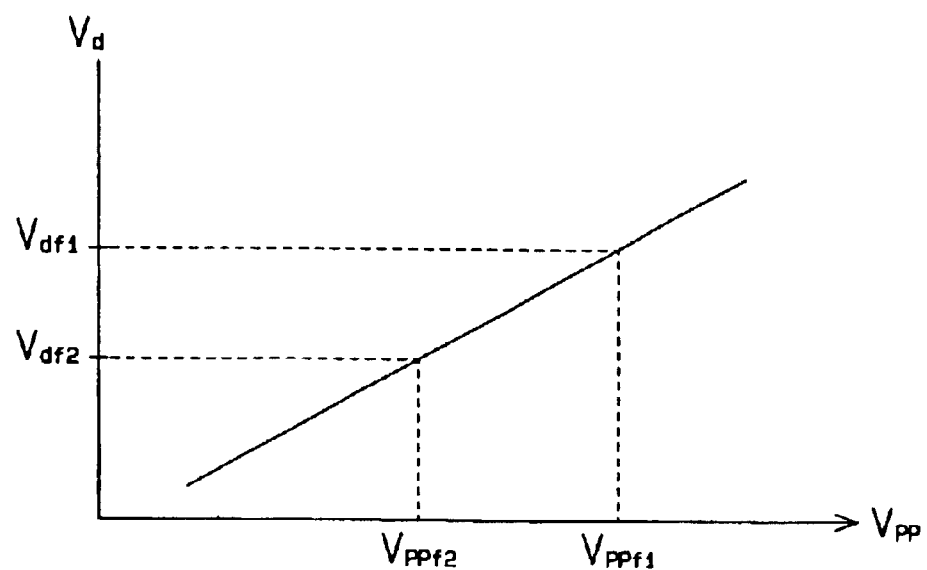
FIG. 11 is a graph showing the relationship between input voltage and output voltage in an amplitude-voltage conversion circuit of the phase shifter circuit of FIG. 9.

The amplitude-voltage conversion circuit 236b receives the output signal Sout from the filter circuit 236a and generates a direct current voltage Vd which corresponds to the amplitude value Vpp of the output signal Sout. Specifically, the amplitude-voltage conversion circuit 236b, as shown in FIG. 11, has amplitude-voltage characteristics that increase the direct current voltage value of the direct current voltage Vd as the amplitude value Vpp of the output signal Sout increases. Accordingly, the amplitude-voltage conversion circuit 236b generates a higher direct current voltage Vd when it receives an output signal Sout (Vppf1) originating from the first frequency f1, than a direct current voltage at the time when it receives an output signal Sout (Vppf2) originating from the second frequency f2. That is Vdf1>Vdf2 wherein it is assumed that the direct current voltage Vd to the amplitude value Vppf1 of the output signal Sout is "Vdf1" and the direct current voltage Vd to the amplitude value Vppf2 of the output signal Sout is "Vdf2".

The comparator 236c receives a direct current voltage Vd from the amplitude-voltage conversion circuit 236b, compares the direct current voltage Vd and a reference voltage Vref and generates a switching signal DVX which indicates the comparison result. The comparator 236c generates a high potential detection signal when the direct current voltage Vd is higher than the reference voltage Vref and generates a low potential detection signal when the direct current voltage Vd is lower than the reference voltage Vref. The reference voltage Vref is set between the direct current voltage Vdf1, Vdf2 (Vdf1>Vref>Vdf2).

The comparator 236c generates a switching signal DVX having the H level if it receives the direct current voltage Vdf1 and the L level if it receives the direct current voltage Vdf2.

The switching circuit section 236d includes a changeover switch 236e. The changeover switch 236e supplies the control signal DA having the voltage of the reference power supply 37 to the bases of the NPN transistors Q11, Q12 of the constant current sources I1, I2 in response to the H-level switching signal DVX. The changeover switch 236e supplies the control signal DB having the voltage of the reference power supply 37 to the bases of the NPN transistors Q13, Q14 of the constant current sources I3, I4 in response to the L-level switching signal DVX.

That is, when an input signal Sin having the first frequency f1 is supplied to the phase shifter circuit 30, the first and second differential amplifiers 32, 33 are activated by the H-level switching signal DVX. When an input signal Sin having the second frequency f2 is supplied to the phase shifter circuit 30, the third and fourth differential amplifiers 34, 35 are activated by the L-level switching signal DVX.

In the third embodiment, the switching control unit 236 generates the control signals DA, DB in accordance with the frequency of the input signal Sin. Accordingly, a control signal from an external device used only for switching a differential amplifier does not need to be received. In other words, the phase shifter circuit 30 does not require an input terminal (input pin) for inputting a control signal from the external device. Accordingly, the phase shifter circuit 30 is compact.

(Fourth Embodiment)

Figure 12:
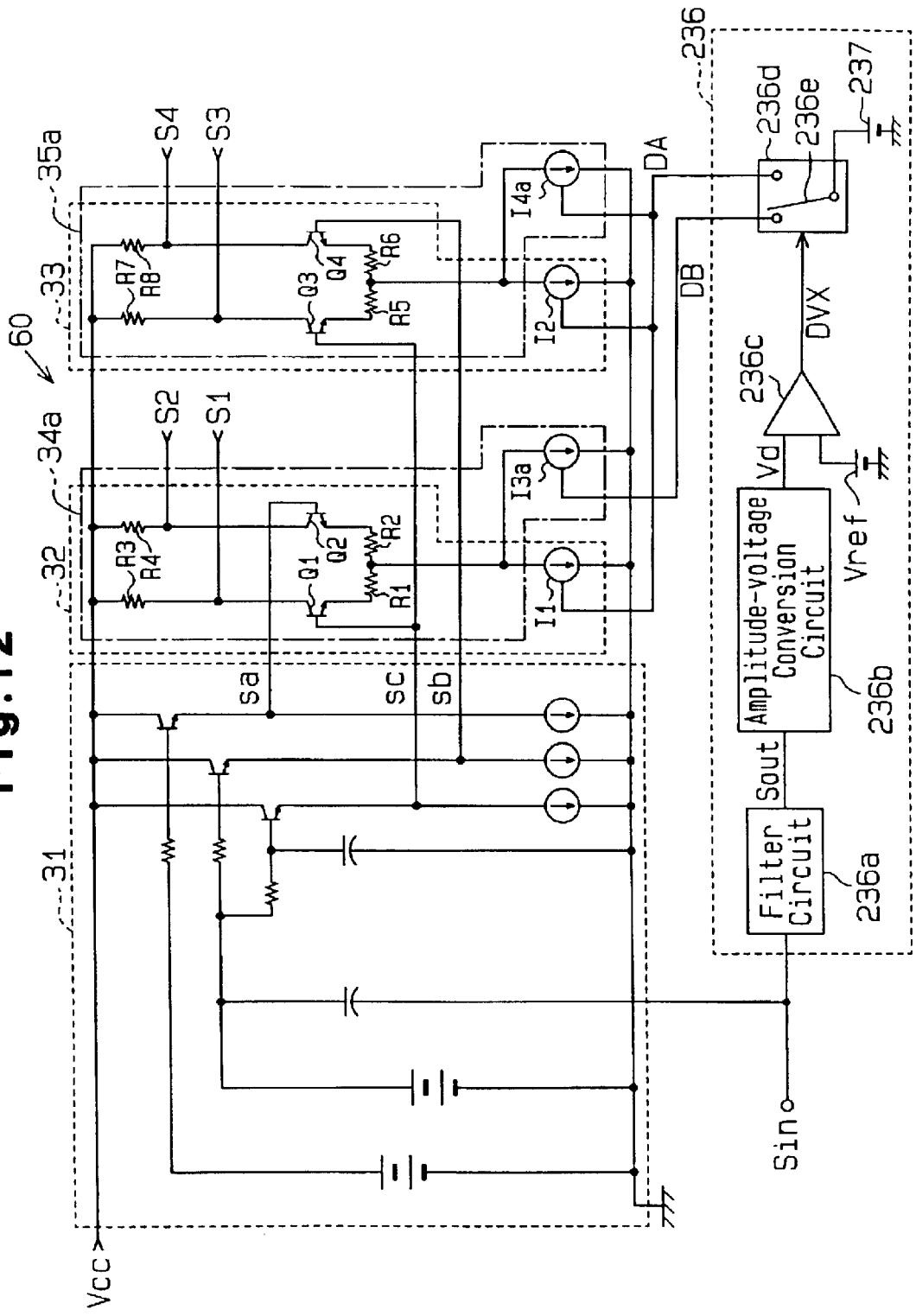
FIG. 12 is a schematic circuit diagram of a phase shifter circuit according to a fourth embodiment of the present invention.

FIG. 12 is a schematic circuit diagram of a phase shifter circuit 60 according to a fourth embodiment of the present invention. The phase shifter circuit 60 has the same differential amplifier configuration as the phase shifter circuit 40 of FIG. 8. That is, the first and third differential amplifiers 32, 34a share the transistors Q1, Q2, the resistors R1, R2 and the load resistors R3, R4, and the second and fourth differential amplifiers 33, 35a share the transistors Q3, Q4, the resistors R5, R6 and the load resistors R7, R8.

(Fifth Embodiment)

Figure 13:
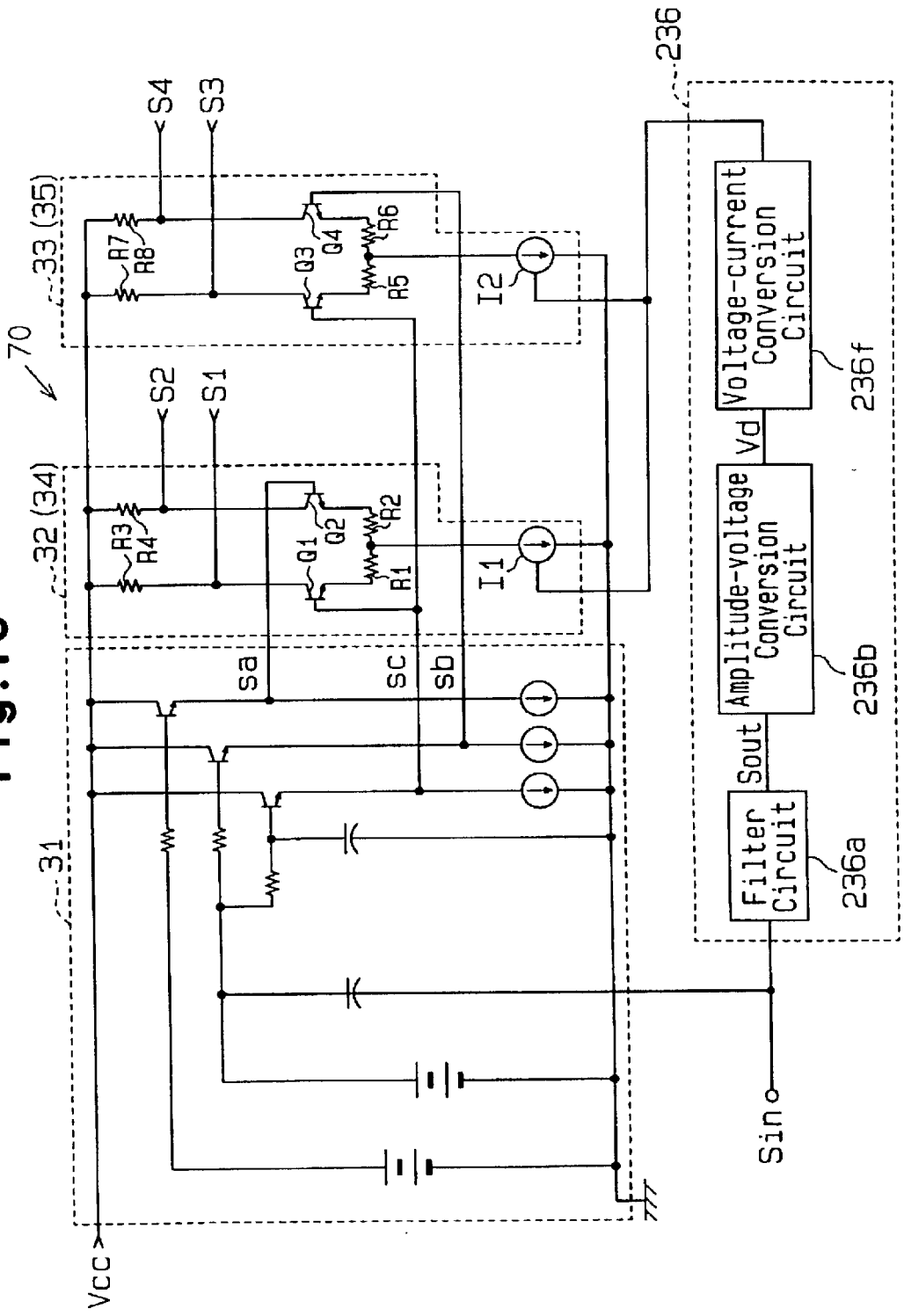
FIG. 13 is a schematic circuit diagram of a phase shifter circuit according to a fifth embodiment of the present invention.

FIG. 13 is a schematic circuit diagram of a phase shifter circuit 70 according to a fifth embodiment of the present invention in which the first and second differential amplifiers 32, 33 also function as the third and fourth differential amplifiers by selectively switching the bias current values of the constant current sources I1, I2. That is, by selectively switching the bias current values of the constant current sources I1, I2, the third and fourth differential amplifiers 34, 35 having gains which differ from those of the first and second differential amplifiers 32, 33 are obtained.

The switching of the bias current values of the constant current sources I1, I2 is performed by switching the base current supplied to the bases of the NPN transistors Q11, Q12 of the constant current sources I1, I2 according to the frequency. Specifically, the switching control unit 236 includes a voltage-current conversion circuit 236f instead of the comparator 236c. The voltage-current conversion circuit 236f generates a current (base current) which corresponds to a direct current voltage Vd from the amplitude-voltage conversion circuit 236b.

For example, if the direct current voltage Vdf1 originating from the first frequency f1 is output from the amplitude-voltage conversion circuit 236b, the voltage-current conversion circuit 236f generates a base current such that the constant current sources I1, I2 supply a bias current which corresponds to the gains of the first and second differential amplifiers 32, 33. Further, if the direct current Vdf2 originating from the second frequency f2 is output from the voltage-current conversion circuit 236b, the voltage-current conversion circuit 236f generates a base current such that the constant current sources I1, I2 supply a bias current which corresponds to the gains of the third and fourth differential amplifiers 34, 35.

In the fifth embodiment, the number of elements is reduced and thus, the circuit area is reduced. Moreover, the voltage-current conversion circuit 236f can also be designed in consideration of the conversion function of the voltage-current conversion circuit 236f so that a phase shift signal having fixed amplitude can be obtained in the frequency band between the first frequency f1 and second frequency f2.

Figure 14:
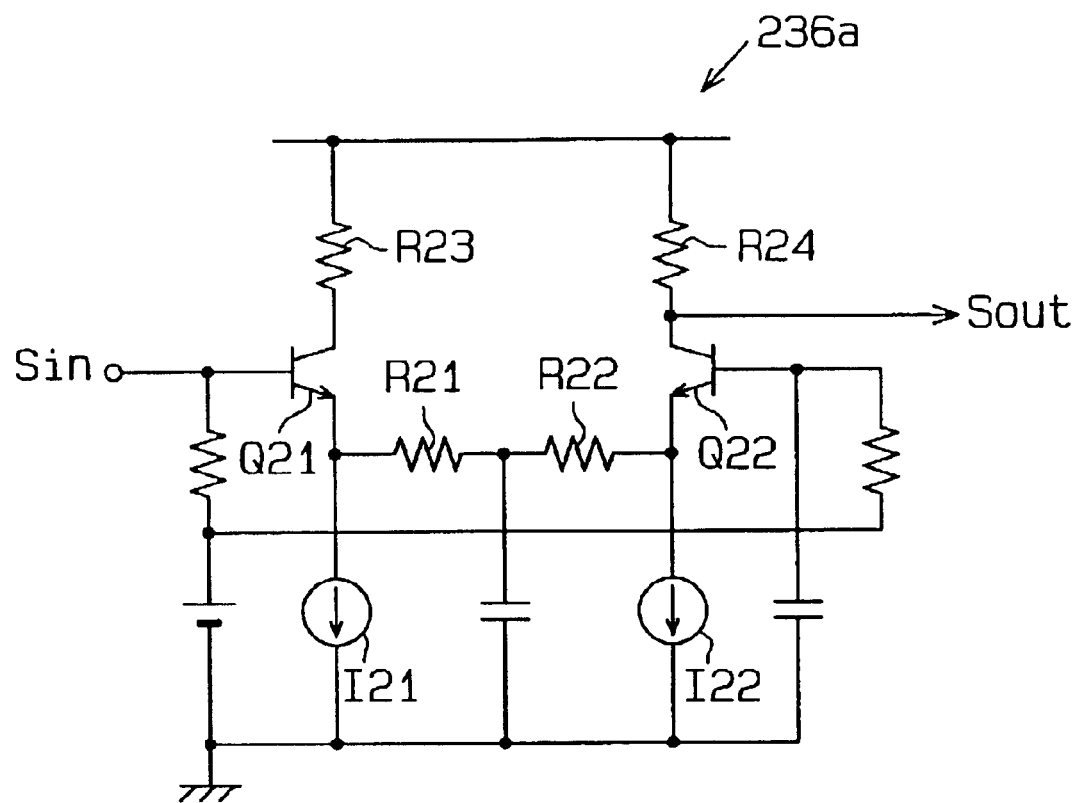
FIG. 14 is a schematic circuit diagram of a filter circuit of the phase shifter circuit of FIG. 9.

It should be apparent to those skilled in the art that the present invention may be embodied in many other specific forms without departing from the spirit or scope of the invention. Particularly, it should be understood that the invention may be embodied in the following forms.

a) A plurality of (two or more) differential amplifiers having amplification factors which differ from the first and second differential amplifiers 32, 33 are provided and each differential amplifier may also be activated selectively by a switching control unit in accordance with three frequencies or more. In this case, at the respective three or more frequencies, each phase shift signal has the same amplitude.

b) For example, when the third and fourth phase shift signals S3, S4 of one differential amplifier (in this case, the second differential amplifier 33) has the same amplitude at the first and second frequencies f1, f2, the fourth differential amplifier 35 is unnecessary. That is, a differential amplifier having a different amplification factor may be provided to at least either of the first and second differential amplifiers 32, 33 in accordance with the characteristics of the phase shift signals S1 to S4.

c) In the third embodiment, a plurality of (two or more) differential amplifiers having amplification factors which are different from those of the first and second differential amplifiers 32, 33 are provided, and the plurality of differential amplifiers may be switched selectively in accordance with the frequency f of an input signal Sin using a switching control unit. In this case, for example, it is desirable that the comparator 236c be replaced by an analog-to-digital conversion circuit. The analog-to-digital conversion circuit generates a digital voltage having a value which corresponds to a direct current voltage Vd from the amplitude-voltage conversion circuit 236b. The switching circuit 236d activates the corresponding differential amplifier in accordance with a digital voltage from the analog-to-digital conversion circuit.

d) The filter circuit 236a of the switching control unit 236, for example, as shown in FIG. 14, includes a pair of differential NPN transistors Q21, Q22, resistors R21, R22, load resistors R23, R24 and constant current sources I21, I22. However, the filter circuit 236a is not restricted to the configuration of FIG. 14.

Therefore, the present examples and embodiments are to be considered as illustrative and not restrictive and the invention is not to be limited to the details given herein, but may be modified within the scope and equivalence of the appended claims.

What is claimed is:

1. A phase shifter circuit, comprising:
   a first differential amplifier for receiving an input signal having a predetermined frequency and generating a first phase shift signal in accordance with a first predetermined gain;
   a second differential amplifier for receiving the input signal and generating a second phase shift signal having a phase difference of 90 degrees between the first and second phase shift signals in accordance with a second predetermined gain; and
   a control circuit, connected to the first and second differential amplifiers, for receiving the input signal and controlling the first and second predetermined gains of the first and second differential amplifiers based on an amplitude of the input signal at the predetermined frequency of the input signal.

2. The phase shifter circuit of claim 1, wherein the predetermined frequency is one of a first frequency and a second frequency, the first and second differential amplifier generate the first and second phase shift signals having a first amplitude when the input signal has the first frequency, and the control circuit controls the first and second predetermined gains so that the first and second differential amplifiers generate the first and second phase shift signals having substantially the same amplitude as the first amplitude when the predetermined frequency changes from the first frequency to the second frequency.

3. The phase shifter circuit of claim 1, wherein the control circuit includes:
   a filter circuit for generating a frequency-amplitude conversion signal having an amplitude corresponding to the predetermined frequency of the input signal;
   an amplitude-voltage conversion circuit, connected to the filter circuit, for generating an amplitude-voltage conversion signal having a voltage corresponding to the amplitude of the frequency-amplitude conversion signal; and
   a control signal generation circuit, connected to the amplitude-voltage conversion circuit, for generating a gain control signal from the amplitude-voltage conversion signal.

4. The phase shifter circuit of claim 3, wherein the control signal generation circuit includes a comparator for receiving the amplitude-voltage conversion signal from the amplitude-voltage conversion circuit and comparing the amplitude-voltage conversion signal and a predetermined reference voltage signal to generate the gain control signal.

5. The phase shifter circuit of claim 3, wherein the first and second differential amplifiers include first and second constant current sources that determine the first and second predetermined gains, respectively, and the control signal generation circuit includes a voltage-current conversion circuit for receiving the amplitude-voltage conversion signal from the amplitude-voltage conversion circuit and supplying a control current corresponding to the voltage of the amplitude-voltage conversion signal to the first and second constant current sources as the gain control signal.

6. A phase shifter circuit, comprising:
   a first differential amplifier for receiving an input signal having a predetermined frequency and generating a first phase shift signal in accordance with a first gain in response to a first control signal;
   a second differential amplifier for receiving the input signal and generating a second phase shift signal having a phase difference of 90 degrees between the first and second phase shift signals in accordance with a second gain in response to the first control signal;
   a third differential amplifier, connected to the first differential amplifier, for receiving the input signal and generating a third phase shift signal in accordance with a third gain that is different from the first gain in response to a second control signal;
   a fourth differential amplifier, connected to the second differential amplifier, for receiving the input signal and generating a fourth phase shift signal in accordance with a fourth gain that is different from the second gain in response to the second control signal; and
   a control circuit, connected to the first to fourth differential amplifiers, for receiving the input signal and selectively supplying the first and second control signals to the first to fourth differential amplifiers based on an amplitude of the input signal at the predetermined frequency of the input signal.

7. The phase shifter circuit of claim 6, wherein the predetermined frequency is one of a first frequency and a second frequency, the control circuit supplies the first control signal to the first and second differential amplifiers when the predetermined frequency is the first frequency and supplies the second control signal to the third and fourth differential amplifiers when the predetermined frequency is the second frequency, and the first to fourth gains are set so that the amplitude of the first and second phase shift signals generated by the first and second differential amplifiers at the first frequency and the amplitude of the third and fourth phase shift signals generated by the third and fourth differential amplifiers at the second frequency are substantially the same.

8. The phase shifter circuit of claim 6, wherein the control circuit includes:
   a filter circuit for generating a frequency-amplitude conversion signal having an amplitude corresponding to the predetermined frequency of the input signal;
   an amplitude-voltage conversion circuit, connected to the filter circuit, for generating an amplitude-voltage conversion signal having a voltage corresponding to the amplitude of the frequency-amplitude conversion signal; and
   a control signal generation circuit, connected to the amplitude-voltage conversion circuit, for generating one of the first and second control signals from the amplitude-voltage conversion signal.

9. The phase shifter circuit of claim 8, wherein the control signal generation circuit includes a comparator for receiving the amplitude-voltage conversion signal from the amplitude-voltage conversion circuit and comparing the amplitude-voltage conversion signal and a predetermined reference voltage signal to generate one of the first and second control signals.

10. A control circuit of a phase shifter circuit for controlling a predetermined gain of the phase shifter circuit, wherein the phase shifter circuit receives an input signal having a predetermined frequency and generates first and second phase shift signals having a phase difference of 90 degrees in accordance with the predetermined gain, the control circuit comprising:
    a control signal generation circuit for receiving the input signal, generating a value of an amplitude corresponding to the predetermined frequency of the input signal, and generating a control signal for changing the predetermined gain of the phase shifter circuit based on a comparison of the value of the amplitude and a predetermined value.

11. The control circuit of claim 10, wherein the control signal generation circuit generates the control signal so that the first and second phase shift signals, which have a phase difference of 90 degrees, have substantially the same amplitude.

12. The control circuit of claim 10, wherein the control signal generation circuit includes:
    a filter circuit for generating a frequency-amplitude conversion signal having an amplitude corresponding to the predetermined frequency of the input signal;
    an amplitude-voltage conversion circuit, connected to the filter circuit, for generating an amplitude-voltage conversion signal having a voltage corresponding to the amplitude of the frequency-amplitude conversion signal; and a generation circuit, connected to the amplitude-voltage conversion circuit, for generating the control signal from the amplitude-voltage conversion signal.

13. The control circuit of claim 12, wherein the generation circuits include a comparator for receiving the amplitude-voltage conversion signal from the amplitude-voltage conversion circuit and comparing the amplitude-voltage conversion signal and a predetermined reference voltage signal to generate the control signal.

14. The control circuit of claim 12, wherein the phase shifter circuit includes a constant current source that determines the predetermined gain, and the generation circuit includes a voltage-current conversion circuit for receiving the amplitude-voltage conversion signal and supplying a control current corresponding to the voltage of the amplitude-voltage conversion signal to the constant current source as the control signal.

15. A method for controlling a predetermined gain of a phase shifter circuit that receives an input signal having a predetermined frequency and generates first and second phase shift signals having a phase difference of 90 degrees from each other in accordance with the predetermined gain, the method comprising the steps of:

generating a frequency-amplitude conversion signal having an amplitude corresponding to the predetermined frequency of the input signal; and changing the predetermined gain of the phase shifter circuit based on a comparison of the amplitude and a predetermined value.

16. A phase shifter circuit, comprising:

a first differential amplifier for receiving an input signal and generating a first phase shift signal in accordance with a first predetermined gain;

a second differential amplifier for receiving the input signal and generating a second phase shift signal having a phase difference of 90 degrees between the first and second phase shift signals in accordance with a second predetermined gain; and a control circuit, connected to the first and second differential amplifiers, for receiving the input signal and changing the first and second predetermined gains of the first and second differential amplifiers based on an amplitude of the input signal.

17. The phase shifter circuit of claim 16, wherein the first and second differential amplifiers generate the first and second phase shift signals having a first amplitude when the input signal has a first frequency, and the control circuit controls the first and second predetermined gains so that the first and second differential amplifiers generate the first and second phase shift signals having substantially the same amplitude as the first amplitude when the input signal has a second frequency that is different from the first frequency.

18. The phase shifter circuit of claim 16, wherein the control circuit includes:

a filter circuit for generating a frequency-amplitude conversion signal having an amplitude corresponding to a frequency of the input signal;

an amplitude-voltage conversion circuit, connected to the filter circuit, for generating an amplitude-voltage conversion signal having a voltage corresponding to the amplitude of the frequency-amplitude conversion signal; and a control signal generation circuit, connected to the amplitude-voltage conversion circuit, for generating a gain control signal from the amplitude-voltage conversion signal.

19. The phase shifter circuit of claim 18, wherein the control signal generation circuit includes a comparator for receiving the amplitude-voltage conversion signal from the amplitude-voltage conversion circuit and comparing the amplitude-voltage, conversion signal and a predetermined reference voltage signal to generate the gain control signal.

20. The phase shifter circuit of claim 18, wherein the first and second differential amplifiers include first and second constant current sources that determine the first and second predetermined gains, respectively, and the control signal generation circuit includes a voltage-current conversion circuit for receiving the amplitude-voltage conversion signal from the amplitude-voltage conversion circuit and supplying a control current corresponding to the voltage of the amplitude-voltage conversion signal to the first and second constant current sources as the gain control signal.

* * * * *